United States Patent [19]

Yang

[11] Patent Number: 5,550,064
[45] Date of Patent: Aug. 27, 1996

[54] METHOD FOR FABRICATING HIGH-VOLTAGE COMPLEMENTARY METAL-OXIDE-SEMICONDUCTOR TRANSISTORS

[75] Inventor: Sheng-Hsing Yang, Hsinchu, Taiwan

[73] Assignee: United Microelectronics Corporation, Hsinchu, Taiwan

[21] Appl. No.: 537,074

[22] Filed: Sep. 29, 1995

[51] Int. Cl.$^6$ .............................................. H01L 21/8238
[52] U.S. Cl. .................................. 437/34; 437/41; 437/57
[58] Field of Search .................................... 437/34, 56, 57, 437/58, 41 RCM; 148/DIG. 53, DIG. 9

[56] References Cited

U.S. PATENT DOCUMENTS

| | | | |
|---|---|---|---|
| 4,818,719 | 4/1989 | Yeh et al. | 437/57 |
| 5,376,568 | 12/1994 | Yang | 437/34 |
| 5,382,820 | 1/1995 | Yang et al. | 437/34 |
| 5,393,679 | 2/1995 | Yang | 437/34 |
| 5,424,226 | 6/1995 | Vo et al. | 437/57 |
| 5,486,482 | 1/1996 | Yang | 437/57 |

*Primary Examiner*—Charles L. Bowers, Jr.
*Assistant Examiner*—Michael Trinh
*Attorney, Agent, or Firm*—Townsend and Townsend and Crew

[57] ABSTRACT

A method for fabricating high-voltage CMOS transistors comprises the steps of: forming a well of a second conductivity type and two lightly-doped diffusion regions of the second conductivity type in a silicon substrate of a first conductivity type; forming a plurality of shielding blocks over the silicon substrate to define source/drain and gate regions; implanting impurities of the first conductivity type in the diffusion regions of the first conductivity type to form drift regions of the first conductivity type therein; implanting impurities of the second conductivity type in the diffusion regions of the second conductivity type to form drift regions of the second conductivity type therein; forming field oxide layers between the shielding blocks over the silicon substrate; removing the shielding blocks; forming gate oxide layers on the exposed surfaces of the silicon substrate and the well respectively; forming gate electrodes over the gate oxide layers; and forming source/drain implanted regions of the first conductivity type in the well and forming source/drain implanted regions of the second conductivity in the silicon substrate.

5 Claims, 5 Drawing Sheets

METHOD FOR FABRICATING HIGH-VOLTAGE COMPLEMENTARY METAL-OXIDE-SEMICONDUCTOR TRANSISTORS

BACKGROUND OF THE INVENTION

1. Field of the Invention

The present invention relates to the fabrication of semiconductor devices, and more specifically, to a method for fabricating high-voltage complementary metal-oxide-semiconductor (CMOS) transistors.

2. Description of the Related Arts

A CMOS transistor is generally fabricated by forming two complementary MOS transistors respectively in two regions of opposite conductivity types on a unique substrate. That is, a CMOS transistor is composed of a pair of NMOS/PMOS transistors which are formed either in a P-type silicon substrate and an N-type well in the substrate, or in an N-type substrate and a P-type well in the substrate. Therefore, the high voltage endurance of the CMOS transistor is dominated by the breakdown voltages of each of the two transistor elements. Namely, in order to improve the high voltage performance of the CMOS transistor, the breakdown voltage of the NMOS and PMOS transistors must be increased.

In the past, heavily-doped source/drain regions of the NMOS and PMOS transistors have been embedded in lightly-doped diffusion regions to disperse the high voltage applied to them, thus increasing their breakdown voltages. However, the high resistance of lightly-doped diffusion regions reduces the channel currents of the transistors, thus affecting the operational speed and current gain of the CMOS transistor. Moreover, in the conventional manufacturing process of the CMOS transistor, the increments of the breakdown voltages are not sufficient. Therefore, a new method for fabricating high-voltage CMOS transistors is needed.

SUMMARY OF THE INVENTION

Accordingly, the present invention intends to provide a method for fabricating high-voltage CMOS transistors to improve their current gain and high-voltage performance.

The method for fabricating high-voltage CMOS transistors according to one preferred embodiment of the invention comprises the steps of: forming a well of a second conductivity type and two lightly-doped diffusion regions of the second conductivity type in a silicon substrate of a first conductivity type; forming a plurality of shielding blocks over the silicon substrate to define source/drain and gate regions; implanting impurities of the first conductivity type in the diffusion regions of the first conductivity type to form drift regions of the first conductivity type therein; implanting impurities of the second conductivity type in the diffusion regions of the second conductivity type to form drift regions of the second conductivity type therein; forming field oxide layers between the shielding blocks over the silicon substrate; removing the shielding blocks; forming gate oxide layers on the exposed surfaces of the silicon substrate and the well respectively; forming gate electrodes over the gate oxide layer; and forming source/drain implanted regions of the first conductivity type in the well and forming source/drain implanted regions of the second conductivity in the silicon substrate.

BRIEF DESCRIPTION OF THE DRAWINGS

Other objects, features, and advantages of the present invention will become apparent from the following detailed description of the preferred but non-limiting embodiments. The description is made with reference to the accompanying

DETAILED DESCRIPTION OF THE INVENTION

The cross-sectional views from FIG. 1 to FIG. 5 illustrate the manufacturing process of a CMOS transistor according to the preferred embodiment of the invention. The CMOS transistor is fabricated on a silicon substrate of a first conductivity type, for example, on a P-type silicon substrate in the preferred embodiment. Therefore, each of the drawings is separated into two portions to illustrate various transistor elements of the CMOS transistor, that is, a right hand portion depicts the formation of a PMOS transistor 10, and a left hand portion shows an NMOS transistor 20.

The manufacturing process of the preferred embodiment comprises the steps of:

STEP 1

Figure 1:
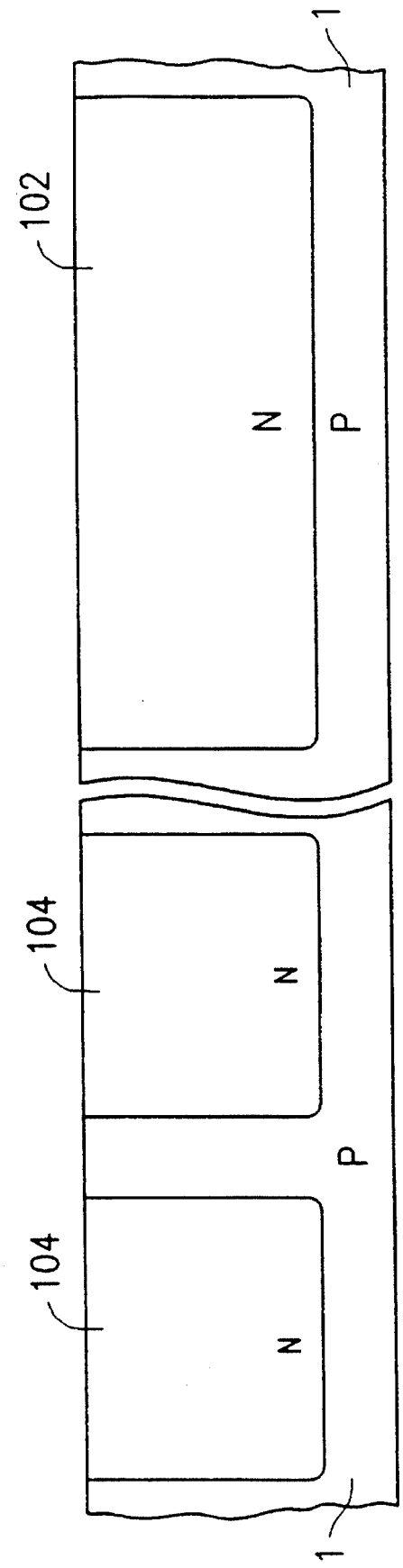
FIG. 1 through FIG. 5 are cross-sectional views illustrating the method for fabricating a CMOS transistor on a P-type silicon substrate according to a preferred embodiment of the present invention.

Referring to FIG. 1, a well of a second conductivity type, for example, an N-type well 102 in the preferred embodiment, is formed in a P-type silicon substrate 1. At the right hand portion of the figure, two lightly-doped diffusion regions of the second conductivity type, for example, two N-type diffusion regions 104 in the preferred embodiment, are also formed in the silicon substrate 1.

The N-type well 102 and diffusion regions 104 are formed by implanting impurities (dopants) of the second conductivity type in the silicon substrate 1 through a photoresist mask which is defined by a photolithography process. For example, phosphoric ions are used for this implantation. In order to obtain broader diffusion regions and a deeper well, a thermal process may be performed to make the dopants diffuse into the silicon substrate 1, thus achieving the effect called "drive in" of the dopants. It is noted that an oxide layer may be formed over the silicon substrate 1 prior to the thermal process for preventing the outward diffusion of ions to the heating chamber.

STEP 2

Figure 2:
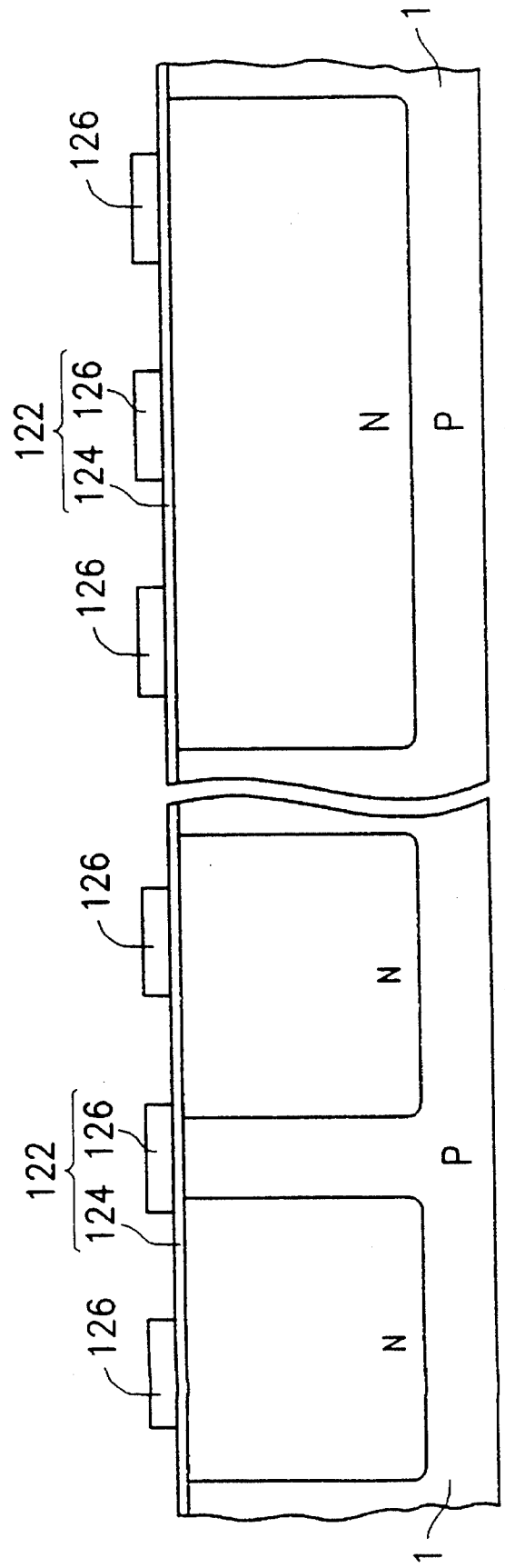

Referring to FIG. 2, a plurality of shielding blocks 122 are formed over the silicon substrate 1 to define source/drain and gate regions of the transistors. In the preferred embodiment, these shielding blocks 122 consist essentially of a pad oxide layer 124 and a nitride layer 126. The pad oxide layer 124 can be formed by a thermal oxidation or a chemical vapor deposition (CVD) process, while the nitride layer 126 is subsequently formed by a CVD process overlying the pad oxide layer 124 and then selectively etched to cover only the regions for the source/drain and gate regions of the transistors.

STEP 3

Figure 3:
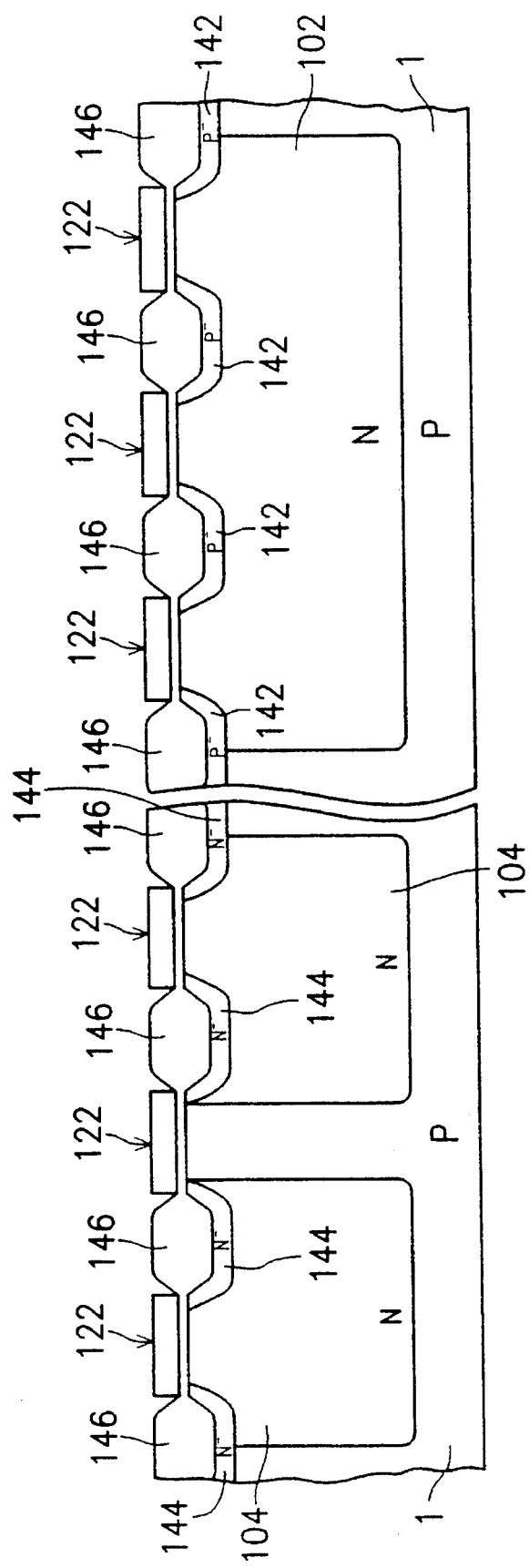

Referring to FIG. 3, drift regions of the first conductivity type, for example, P⁻ type drift regions 142, are formed in the diffusion regions 112; and drift regions of the second conductivity type, for example, N⁻ type drift regions 144, are formed in the diffusion regions 104. These drift regions are formed through two subsequent ion implantation steps each utilizing an implantation mask to protect one of the right- and left-hand portions shown in FIG. 3. That is, when P-type ions are about to be implanted to form the drift regions 142, a photoresist mask is used to cover the surface of the left-hand portion of FIG. 3. On the other hand, when N-type ions are about to be implanted to form the drift regions 144, there must be another photoresist mask overlying the surface of the right-hand portion of the structure of FIG. 3.

Then, a plurality of field oxide layers 146 are formed over silicon substrate 1 through an oxidation process which uses the shielding blocks 126 as a mask. Since shielding blocks 126 define the source/drain and gate regions of the transistors, these field oxides can be precisely located away from active regions of the transistors and can be used as the isolation. The shielding blocks 126 can be removed after the formation of field oxide layers 146.

STEP 4

Figure 4:
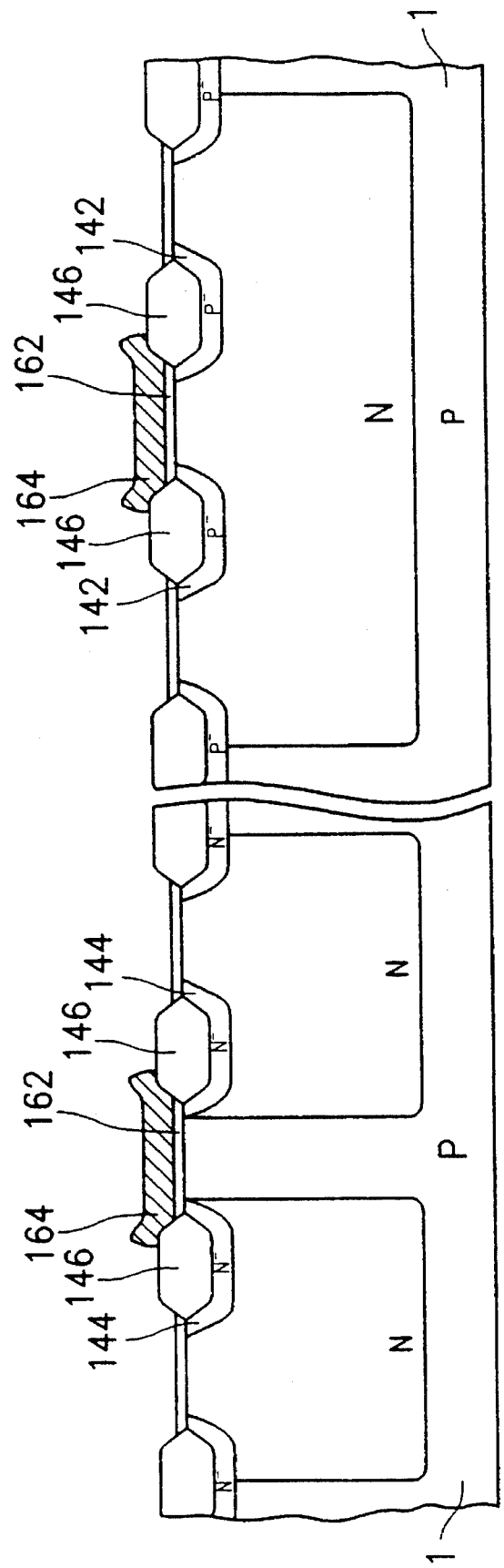

Referring to FIG. 4, gate oxide layers 162 are respectively formed between two drift regions 142 over the N-type well 102 and between two drift regions 144 over the P-type silicon substrate 1, thus defining a P-type channel and an N-type channel. These gate oxide layers can be formed by performing an oxidation process. Then a conducting layer can be formed over the gate oxide layers 162 and etched back to constitute gate electrodes 164 of the transistors. For example, a polysilicon layer can be deposited over the above-mentioned layers after the formation of gate oxide layers 162. Through an ion implantation step or doping ions during the deposition, the polysilicon layer contains enough impurities to increase its conductivity. Therefore, through a photography step and an etching process to the polysilicon layer, the gate electrodes 164 are formed over the gate oxide layer 162.

STEP 5

Figure 5:
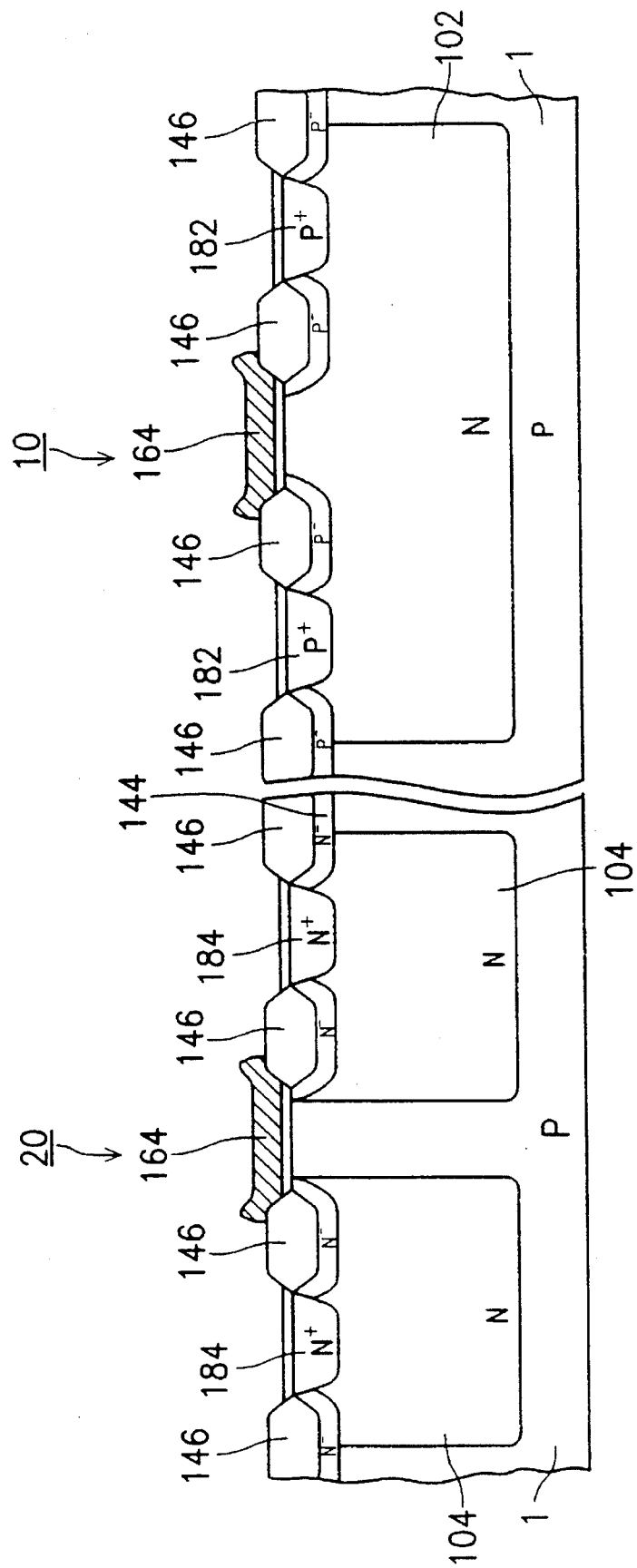

Referring to FIG. 5, implanted regions of the first conductivity type, for example, P$^+$ type source/drain regions 182, are formed in the well 102; and implanted regions of the second conductivity type, for example, N$^+$ type source/drain regions 184 are formed in the silicon substrate 1. These source/drain regions 182 and 184 are formed through ion implantation steps by utilizing the field oxide layers 146 and the gate electrodes 164 as masks. During the formation of P$^+$ type source/drain regions 182, the structure in the left hand portion of FIG. 5 is protected by a photoresist layer, and during the formation of N$^+$ type source/drain regions 184, the structure in the right hand portion of FIG. 5 is protected by another photoresist layer, thereby preventing the compensation of ions of opposite conductivity types. This completes the preferred embodiment of a method for fabricating a CMOS transistor on a semiconductor substrate in accordance with the present invention.

Since the CMOS transistor fabricated according to the preferred embodiment of the invention provides the drift regions connecting the source/drain regions to the channel regions, and the drift regions have higher conductivity, the high resistance of lightly-doped diffusion regions will not affect the saturation currents of the transistors. Therefore, the CMOS transistor provides high current gain and very good high voltage performance.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating a CMOS transistor on a silicon substrate of a first conductivity type, comprising the steps of:

forming a well of a second opposite conductivity type and two lightly-doped diffusion regions of the second conductivity type in said silicon substrate;

forming a plurality of shielding blocks over said silicon substrate to define source/drain and gate regions;

implanting impurities of the first conductivity type in said well of the second conductivity type by using the shielding blocks as marks to form drift regions of the first conductivity type therein;

implanting impurities of the second conductivity type in said diffusion regions of the second conductivity type by using the shielding blocks as marks to form drift regions of the second conductivity type therein;

forming field oxide layers between said shielding blocks over said silicon substrate;

removing said shielding blocks to expose surfaces of said silicon substrate between the two diffusion regions and said well;

forming gate oxide layers on the exposed surfaces of said silicon substrate and said well respectively;

forming gate electrodes on said gate oxide layers;

implanting impurities into said well to form source and drain regions of the first conductivity type; and implanting impurities into said diffusion regions and to form a drain region in the other one of the two diffusion regions.

2. The method of claim 1, wherein said shielding blocks consist essentially of oxide and nitride.

3. The method of claim 1, wherein said gate electrodes are polysilicon gate electrodes.

4. The method of claim 1, wherein said first conductivity type is N-type and said second conductivity type is P-type.

5. The method of claim 1, wherein said first conductivity type is P-type and said second conductivity type is N-type.

* * * * *